(12) United States Patent
Jung et al.

(10) Patent No.: US 8,053,895 B2
(45) Date of Patent: Nov. 8, 2011

(54) METAL LINE OF SEMICONDUCTOR DEVICE HAVING A MULTILAYER MOLYBDENUM DIFFUSION BARRIER AND METHOD FOR FORMING THE SAME

(75) Inventors: Dong Ha Jung, Gyeonggi-do (KR); Seung Jin Yeom, Gyeonggi-do (KR); Baek Mann Kim, Gyeonggi-do (KR); Nam Yeal Lee, Gyeonggi-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 157 days.

(21) Appl. No.: 12/486,454

(22) Filed: Jun. 17, 2009

(65) Prior Publication Data

US 2010/0052170 A1    Mar. 4, 2010

(30) Foreign Application Priority Data

Aug. 29, 2008   (KR) .................. 10-2008-0085396

(51) Int. Cl.
*H01L 23/48* (2006.01)
*H01L 23/52* (2006.01)
*H01L 29/40* (2006.01)

(52) U.S. Cl. ........ 257/763; 257/751; 257/764; 257/767; 257/770

(58) Field of Classification Search .................. 257/751, 257/763, 764, 767, 770
See application file for complete search history.

(56) References Cited

U.S. PATENT DOCUMENTS

| | | | | |
|---|---|---|---|---|
| 5,528,081 A | * | 6/1996 | Hall | 257/768 |
| 5,670,823 A | * | 9/1997 | Kruger et al. | 257/751 |
| 6,271,592 B1 | * | 8/2001 | Kim et al. | 257/751 |
| 2006/0024953 A1 | | 2/2006 | Papa Rao et al. | |
| 2006/0251800 A1 | * | 11/2006 | Weidman et al. | 427/99.5 |
| 2007/0190780 A1 | * | 8/2007 | Chung et al. | 438/675 |

FOREIGN PATENT DOCUMENTS

KR     2008-62556 A    7/2008

* cited by examiner

*Primary Examiner* — Minh-Loan T Tran
*Assistant Examiner* — Teresa M Arroyo
(74) *Attorney, Agent, or Firm* — Ladas & Parry LLP

(57) ABSTRACT

A metal line of a semiconductor device includes an insulation layer formed on a semiconductor substrate. The insulation layer has a metal line forming region. A diffusion barrier is formed on a surface of the metal line forming region of the insulation layer. The diffusion barrier includes a multi-layered structure that includes an $MoB_2$ layer, an $Mo_xB_yN_z$ layer and an Mo layer. A metal layer is formed on the diffusion barrier to fill the metal line forming region of the insulation layer.

14 Claims, 4 Drawing Sheets

METAL LINE OF SEMICONDUCTOR DEVICE HAVING A MULTILAYER MOLYBDENUM DIFFUSION BARRIER AND METHOD FOR FORMING THE SAME

CROSS-REFERENCE TO RELATED APPLICATIONS

The present application claims priority to Korean patent application number 10-2008-0085396 filed on Aug. 29, 2008, which is incorporated herein by reference in its entirety.

BACKGROUND OF THE INVENTION

The present invention relates generally to a metal line of a semiconductor device and a method for forming the same, and more particularly, to a metal line of a semiconductor device having a diffusion barrier with improved characteristics thereby improving the characteristics of a metal line, and a method for forming the same.

In a typical semiconductor device, metal lines are formed to electrically connect elements or lines to each other, and contact plugs are formed to connect lower metal lines to upper metal lines. In order to conform to the trend towards high integration in semiconductor devices, the design rule of a semiconductor device has decreased. When the design rule is decreased, the aspect ratio of a contact hole in which a contact plug is to be formed is increased. The increase in the aspect ratio of a contact hole leads to difficulty in forming the metal line and the contact plug, and thus the importance of the metal line an contact plug forming processes has been noted.

Aluminum and tungsten have wide use as a material for forming the metal line of a semiconductor device due to the good electrical conductivity of these materials. Recent undertakings have explored the potential of copper as a next-generation material for a metal line due to the excellent electrical conductivity and the low resistance of copper when compared to aluminum and tungsten. Copper (Cu) can therefore solve the problems associated with RC (resistance-capacitance) signal delay in a semiconductor device having a high level of integration and high operating speed.

However, unlike aluminum, when copper is used as the material for a metal line, copper diffuses through an insulation layer to the semiconductor substrate. Semiconductor substrates are typically made of silicon, and the diffused copper acts as a deep-level impurity and induces leakage current. Therefore, it is necessary to form a diffusion barrier at the interface between a copper layer for a metal line and the insulation layer.

Hereinbelow, a conventional method for forming a metal line of a semiconductor device will be briefly described.

After forming an insulation layer on a semiconductor substrate, a metal line forming region is defined by etching the insulation layer. Then, a diffusion barrier is formed on the insulation layer including on the surface of the metal line forming region, and a copper seed layer is formed on the diffusion barrier. Next, a copper layer is formed on the copper seed layer, and the copper layer is chemically and mechanically polished (CMP) to form a metal line comprising the copper layer.

However, in the conventional method described above, as the size of cells decreases in conformance with the trend toward high integration of a semiconductor device, it becomes difficult to properly prevent the diffusion of a copper constituent by means of the diffusion barrier formed according to the conventional method.

Also, in the conventional method described above, it is difficult to increase the thickness of the diffusion barrier so as to improve the characteristics of the diffusion barrier. Due to this fact, the characteristics of the diffusion barrier become worse, and thereby the resistance of the metal line increases. As a consequence, the characteristics and the reliability of the semiconductor device along with the characteristics of a metal line are likely to be diminished.

BRIEF SUMMARY OF THE INVENTION

Embodiments of the present invention include a metal line of a semiconductor device having a diffusion barrier with improved characteristics and a method for forming the same.

Also, embodiments of the present invention include a metal line of a semiconductor device which can improve the characteristics of a metal line and a method for forming the same.

In one aspect of the present invention, a metal line of a semiconductor device comprises an insulation layer formed on a semiconductor substrate and having a metal line forming region; a diffusion barrier formed on a surface of the metal line forming region of the insulation layer and having a multi-layered structure of an $MoB_2$ layer, an $Mo_xB_yN_z$ layer and an Mo layer; and a metal layer formed on the diffusion barrier filling the metal line forming region of the insulation layer.

In the $Mo_xB_yN_z$ layer, x may have a range of 0.33~0.53, y may have a range of 0.37~0.57, and z may have a range of 0.1~3.

The $Mo_xB_yN_z$ layer may have an amorphous phase.

The metal layer may include a copper layer.

In another aspect of the present invention, a method for forming a metal line of a semiconductor device comprises the steps of forming an insulation layer on a semiconductor substrate to have a metal line forming region; forming a diffusion barrier on the insulation layer including a surface of the metal line forming region to have a multi-layered structure of an $MoB_2$ layer, an $Mo_xB_yN_z$ layer and an Mo layer; and forming a metal line on the diffusion barrier to fill the metal line forming region.

The step of forming the diffusion barrier may include the steps of forming an $MoB_2$ layer on the insulation layer including a surface of the metal line forming region; forming an $Mo_xB_yN_z$ layer on an upper part of the $MoB_2$ layer by nitridating the $MoB_2$ layer; and forming an Mo layer on the $Mo_xB_yN_z$ layer.

Nitridation is executed in an $N_2$ or $NH_3$ atmosphere.

The nitridation may be executed through an annealing type or plasma type processing.

The annealing may be conducted at a temperature of 400~800° C.

In the $Mo_xB_yN_z$ layer, x may have a range of 0.33~0.53, y may have a range of 0.37~0.57, and z may have a range of 0.1~3.

The $Mo_xB_yN_z$ layer may be formed to have an amorphous phase.

The metal layer may comprise a copper layer.

BRIEF DESCRIPTION OF THE DRAWINGS

The above and other features and advantages of the present invention will become more apparent to those of ordinary skill in the art by describing in detail exemplary embodiments thereof with reference to the attached drawings, which are not necessarily to scale and in some instances proportions may have been exaggerated in order to more clearly depict certain features of the invention.

DESCRIPTION OF SPECIFIC EMBODIMENTS

In an embodiment of the present invention, when forming a metal line using a copper layer, a diffusion barrier comprising a multi-layered structure including an $MoB_2$ layer, an $Mo_xB_yN_z$ layer and an Mo layer is formed to prevent the diffusion of a copper constituent. In particular, the $Mo_xB_yN_z$ layer of the diffusion barrier is formed to have an amorphous phase. In this embodiment, due to the fact that the $MoB_2$ layer is a thermally stable compound, an Mo constituent is never solid-solved in copper, and the $Mo_xB_yN_z$ layer has an amorphous phase in which grain boundaries do not exist, it is possible in the present invention to form a diffusion barrier having improved characteristics when compared to the conventional art.

Also, in the present invention, because the Mo layer has very low specific resistance of 5.34 $\mu\Omega/cm^2$, the Mo layer can not only prevent the diffusion of the copper constituent, but can also can serve as a seed layer. Accordingly, in the present invention, it is not necessary to form an additional seed layer on the diffusion barrier. As a result, in the present invention, the proportion of the copper layer in a metal line forming region can be increased, whereby the characteristics of a metal line can be improved when compared to the conventional art.

Hereafter, specific embodiments of the present invention will be described in detail with reference to the accompanying drawings.

Figure 1:
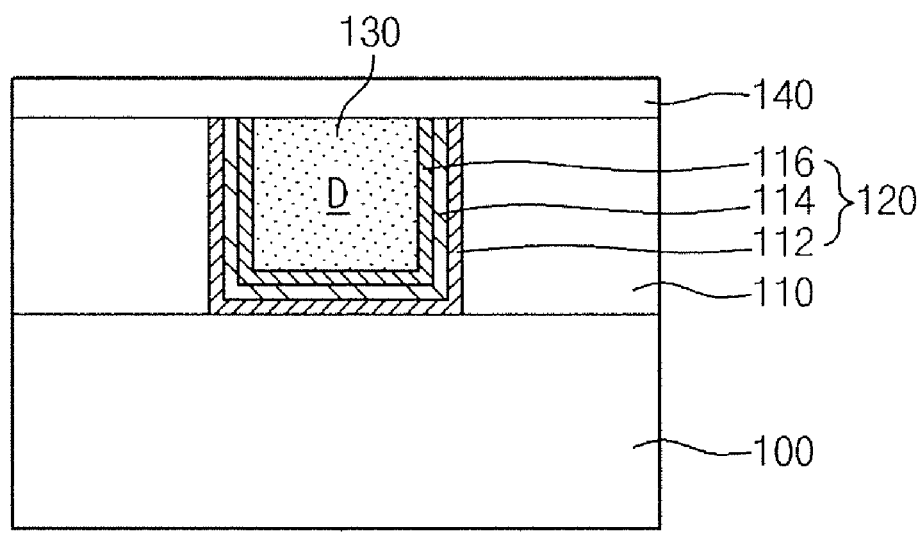
FIG. 1 is a cross-sectional view showing a metal line of a semiconductor device in accordance with an embodiment of the present invention.

FIG. 1 is a cross-sectional view showing a metal line of a semiconductor device in accordance with an embodiment of the present invention.

Referring to FIG. 1, an insulation layer 110 is formed on a semiconductor substrate 100 to have a metal line forming region D. In an embodiment of the present invention, the semiconductor substrate is formed with a predetermined understructure (not shown). The metal line forming region D is defined for a single damascene process, or alternatively a dual damascene process to have a trench structure or a trench and via-hole structure which has a trench and at least one via-hole communicating with the trench. While not shown in a drawing, it is conceivable that in an embodiment the insulation layer 110 can comprise a stack structure of first and second insulation layers. In this case, an etch stop layer is formed between the first and second insulation layers. The etch stop layer comprises, for example, an SiN layer.

In the embodiment of the present invention shown in FIG. 1, a diffusion barrier 120, which comprises the multi-layered structure including an $MoB_2$ layer 112, an $Mo_xB_yN_z$ layer 114 and an Mo layer 116, is formed on the surface of the metal line forming region D which is defined in the insulation layer 110 (that is, defined in a trench within the insulation layer). In the $Mo_xB_yN_z$ layer 114 of the diffusion barrier 120, x has a range of 0.33~0.53, y has a range of 0.37~0.57, and z has a range of 0.1~3. The $Mo_xB_yN_z$ layer 114 has an amorphous phase in which grain boundaries do not exist.

A metal line 130 is formed on the diffusion barrier 120 to fill the metal line forming region D. In an embodiment of the present invention, the metal line 130 comprises a copper layer. A capping layer 140 is formed on the insulation layer 110 including on the metal line 130.

The metal line 130 according to an embodiment of the present invention includes the diffusion barrier 120, which is formed between the copper layer and the insulation layer 110 and comprises the multi-layered structure including the $MoB_2$ layer 112, the $Mo_xB_yN_z$ layer 114 of the amorphous phase and the Mo layer 116. The $MoB_2$ layer 112 of the diffusion barrier 120 is a thermally stable compound having a melting point of 2,280° C. and contains an Mo constituent which is never solid-solved in copper; therefore, the diffusion barrier 120 for preventing the diffusion of copper can have excellent characteristics. Also, since the $Mo_xB_yN_z$ layer 114 of the diffusion barrier 120 has an amorphous phase in which grain boundaries do not exist, the diffusion of copper can be effectively prevented.

Accordingly, because the diffusion barrier 120 according to an embodiment of the present invention has the multi-layered structure including the $MoB_2$ layer 112, the $Mo_xB_yN_z$ layer 114 and the Mo layer 116, the diffusion barrier 120 itself has improved characteristics. Therefore, in the present invention, the diffusion of a copper constituent can be prevented even without increasing the thickness of the diffusion barrier 120.

Further, the Mo layer 116 of the diffusion barrier 120, which has a very low specific resistance, can serve as not only the diffusion barrier 120 but also the seed layer of the copper layer. As such, the semiconductor device according to an embodiment of the present invention does not require an additional seed layer; and therefore, the proportion of the copper layer in the metal line forming region D can be increased, whereby improved characteristics of the metal line 130 can be accomplished. Thus, the present invention can be advantageously applied to the manufacturing process of a highly integrated semiconductor device having a fine width.

As a result, in the metal line 130 formed using the copper line according to an embodiment of the present invention, because of the multi-layered structure of the diffusion barrier, which includes the $MoB_2$ layer 112, the $Mo_xB_yN_z$ layer 114 and the Mo layer 116, the characteristics of the diffusion barrier 120 can be improved, and the characteristics of the metal line 130 can be improved. Thus, in the present invention, the characteristics and the reliability of a semiconductor device can be improved.

FIGS. 2A through 2F are cross-sectional views shown for illustrating the processes of a method for forming a metal line of a semiconductor device in accordance with another embodiment of the present invention. The method will be described below.

Figure 2A:
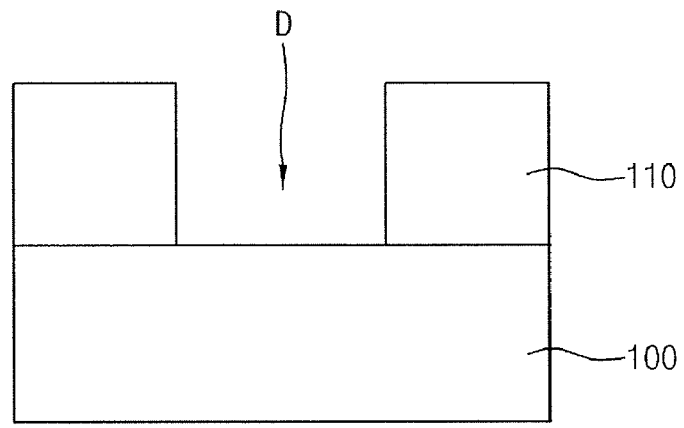
FIGS. 2A through 2F are cross-sectional views shown for illustrating the processes of a method for forming a metal line of a semiconductor device in accordance with another embodiment of the present invention.

Referring to FIG. 2A, an insulation layer 110 is formed on a semiconductor substrate 100, which in an embodiment is formed with a predetermined understructure (not shown), in such a way as to cover the understructure. A metal line forming region D is defined by etching the insulation layer 110. The metal line forming region D is defined for a single damascene process or a dual damascene process in such a way as to have a trench structure or a trench and via-hole structure which has a trench and at least one via-hole communicating with the trench.

Figure 2B:
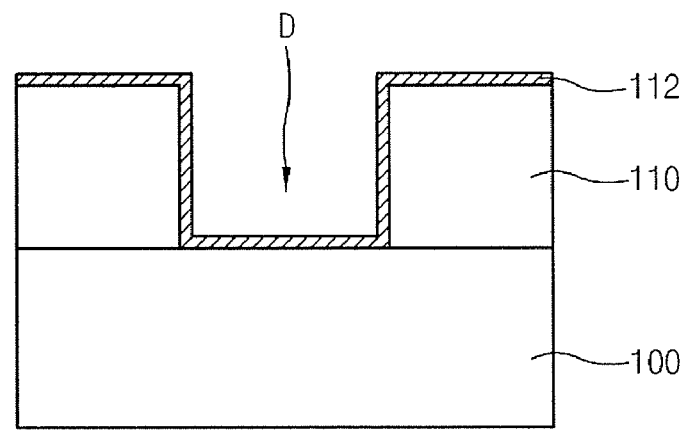

Referring to FIG. 2B, an $MoB_2$ layer 112 is formed on the insulation layer 110 including on the surface of the metal line forming region D. In an embodiment of the present invention, the $MoB_2$ layer 112 is formed, for example, through sputtering.

Figure 2C:
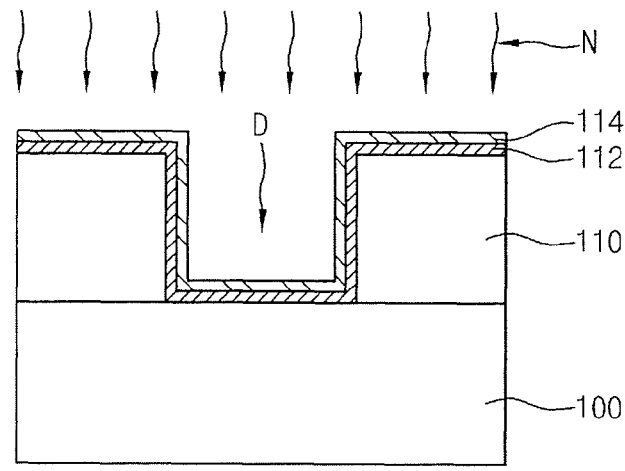

Referring to FIG. 2C, nitridation N is executed for the $MoB_2$ layer 112. The nitridation N is executed, for example, through annealing or plasma processing, preferably, in an $N_2$ or $NH_3$ atmosphere. The annealing is conducted at a temperature in the range of 400~800° C., and preferably, 600° C. As a result, an $Mo_xB_yN_z$ layer 114 having no grain boundaries is formed on the upper part of the $MoB_2$ layer 112, which has a crystalline phase. In the $Mo_xB_yN_z$ layer 114, x has a range of 0.33~0.53, y has a range of 0.37~0.57, and z has a range of 0.1~3.

Figure 2D:
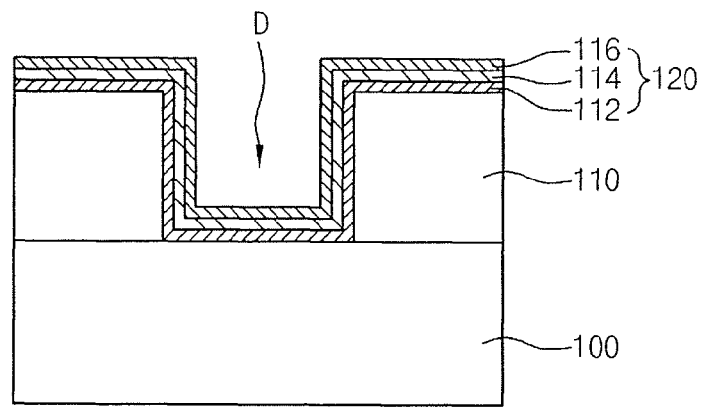

Referring to FIG. 2D, an Mo layer 116 is formed on the $Mo_xB_yN_z$ layer 114 so as to form a diffusion barrier 120 comprising the multi-layered structure including the $MoB_2$ layer 112, the $Mo_xB_yN_z$ layer 114 and the Mo layer 116 on the insulation layer 110 including on the surface of the metal line forming region D. By forming the Mo layer 116, the fine voids created when executing the nitridation N can be removed. In detail, by forming the Mo layer 116, volume change caused by the nitridation N executed in the annealing type processing can be compensated for, and the fine voids created due to the damage caused by the ions produced by the nitridation N executed in the plasma type processing can be removed.

Due to the fact that the $MoB_2$ layer 112 is a very thermally stable compound, an Mo constituent is never solid-solved in copper, and the $Mo_xB_yN_z$ layer 114 has an amorphous phase in which grain boundaries do not exist; the diffusion barrier 120 having the multi-layered structure of the $MoB_2$ layer 112, the $Mo_xB_yN_z$ layer 114 and the Mo layer 116 can effectively prevent the diffusion of a copper layer.

Figure 2E:
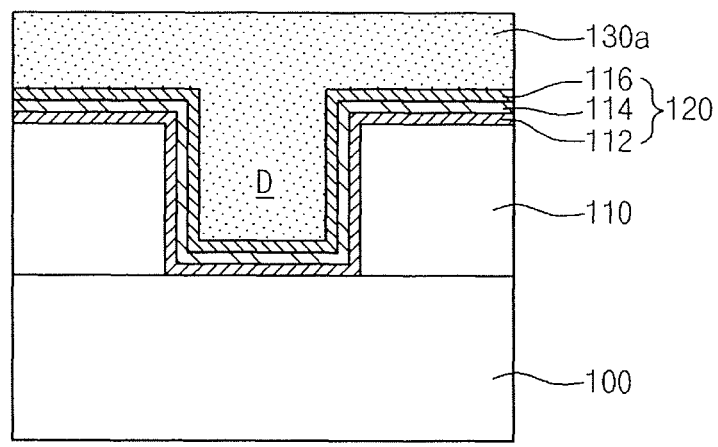

Referring to FIG. 2E, a metal layer 130a is formed on the diffusion barrier 120 to fill the metal line forming region D. The metal layer 130a preferably comprises a copper layer. In an embodiment of the present invention, the copper layer is formed, for example, through electroplating.

Since the Mo layer 116 of the diffusion barrier 120 has a very low specific resistance of 5.34 $\mu\Omega/cm^2$, the Mo layer 116 can serve as a seed layer when forming the copper layer through electroplating. As such, in the present invention, it is not necessary to deposit an additional seed layer on the diffusion barrier 120; and therefore, the present invention can be applied advantageously to the manufacturing process of a semiconductor device having a fine width (i.e., highly integrated). Also, in the present invention, because it is not necessary to form an additional seed layer, the proportion of the metal layer 130a in the metal line forming region D can be increased, whereby the characteristics of a metal line can be improved.

Figure 2F:
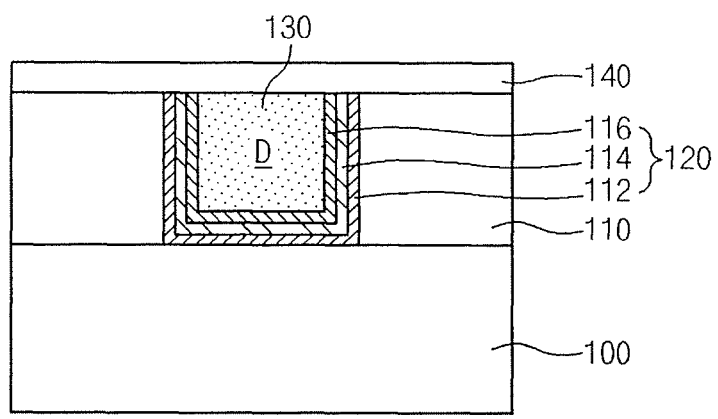

Referring to FIG. 2F, the metal layer 130a and the diffusion barrier 120 are CMPed until the insulation layer 110 is exposed to form a metal line 130 filling the metal line forming region D. A capping layer 140 is formed on the insulation layer 110 formed with the metal line 130.

Thereafter, while not shown in a drawing, by sequentially conducting a series of well-known subsequent processes, the formation of the metal line of a semiconductor device according to the embodiment of the present invention is completed.

As is apparent from the above description, in an embodiment of the present invention a diffusion barrier comprising a multi-layered structure including an $MoB_2$ layer, an amorphous $Mo_xB_yN_z$ layer and an Mo layer is formed when forming a metal line comprising a copper layer. As such, the characteristics of the diffusion barrier can be improved even without increasing the thickness thereof when compared to the conventional art. Through this, it is possible to prevent the constituent of the copper layer from diffusing to an insulation layer. Accordingly, in the present invention, the characteristics and the reliability of a semiconductor device can be improved.

Further, in the present invention, since the Mo layer of the diffusion barrier serves as a seed layer when forming the copper layer, it is not necessary to form an additional seed layer on the diffusion barrier. Therefore, the present invention can be applied advantageously to the manufacturing process of a semiconductor device having a fine width.

Although specific embodiments of the present invention have been described for illustrative purposes, those skilled in the art will appreciate that various modifications, additions and substitutions are possible, without departing from the scope and the spirit of the invention as disclosed in the accompanying claims.

What is claimed is:

1. A metal line of a semiconductor device comprising an insulation layer that is formed on a semiconductor substrate and that has a metal line forming region, the metal line comprising:
    a diffusion barrier formed on a surface of the metal line forming region of the insulation layer, the diffusion barrier comprising a multi-layered structure including an $MoB_2$ layer, an $Mo_xB_yN_z$ layer and an Mo layer; and
    a metal layer formed on the diffusion barrier in the metal line forming region of the insulation layer.

2. The metal line according to claim 1, wherein the metal line forming region is defined within the insulation layer, and the metal layer is formed on the diffusion barrier to fill the metal line forming region.

3. The metal line according to claim 1, wherein, in the $Mo_xB_yN_z$ layer, x has a range of 0.33~0.53, y has a range of 0.37~0.57, and z has a range of 0.1~3.

4. The metal line according to claim 1, wherein the $Mo_xB_yN_z$ layer has an amorphous phase.

5. The metal line according to claim 1, wherein the metal layer comprises a copper layer.

6. A method for forming a metal line of a semiconductor device, comprising the steps of:
    forming an insulation layer having a metal line forming region on a semiconductor substrate;
    forming a diffusion barrier comprising a multi-layered structure including an $MoB_2$ layer, an $Mo_xB_yN_z$ layer and an Mo layer on the insulation layer including on a surface of the metal line forming region; and
    forming a metal line on the diffusion barrier in the metal line forming region.

7. The method according to claim 6, wherein the step of forming an insulation layer having a metal line forming region comprises etching the insulation layer such that the metal line forming region is defined within the insulation layer, and wherein the metal line is formed to fill the metal line forming region defined in the insulation layer.

8. The method according to claim 6, wherein the step of forming the diffusion barrier comprises the steps of:
    forming the $MoB_2$ layer on the insulation layer including on the surface of the metal line forming region;
    forming the $Mo_xB_yN_z$ layer on an upper part of the $MoB_2$ layer by nitridating the $MoB_2$ layer; and
    forming the Mo layer on the $Mo_xB_yN_z$ layer.

9. The method according to claim 8, wherein nitridation is executed in an $N_2$ or $NH_3$ atmosphere.

10. The method according to claim 8, wherein the nitridation is executed through an annealing type or a plasma type processing.

11. The method according to claim 10, wherein the nitridation is executing through an annealing type processing, and the annealing is conducted at a temperature of 400~800° C.

12. The method according to claim 6, wherein, in the $Mo_x B_y N_z$ layer, x has a range of 0.33~0.53, y has a range of 0.37~0.57, and z has a range of 0.1~3.

13. The method according to claim 6, wherein the $Mo_x B_y N_z$ layer is formed to have an amorphous phase.

14. The method according to claim 6, wherein the metal layer comprises a copper layer.

* * * * *